United States Patent
Kurosawa et al.

(10) Patent No.: US 9,394,606 B2
(45) Date of Patent: Jul. 19, 2016

(54) PRODUCTION METHOD FOR POLYCRYSTALLINE SILICON, AND REACTOR FOR POLYCRYSTALLINE SILICON PRODUCTION

(71) Applicant: Shin-Etsu Chemical Co., Ltd., Chiyoda-ku (JP)

(72) Inventors: Yasushi Kurosawa, Niigata (JP); Shigeyoshi Netsu, Niigata (JP); Naruhiro Hoshino, Niigata (JP); Tetsuro Okada, Niigata (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/354,042

(22) PCT Filed: Nov. 29, 2012

(86) PCT No.: PCT/JP2012/007674
§ 371 (c)(1),
(2) Date: Apr. 24, 2014

(87) PCT Pub. No.: WO2013/080556
PCT Pub. Date: Jun. 6, 2013

(65) Prior Publication Data
US 2014/0302239 A1 Oct. 9, 2014

(30) Foreign Application Priority Data
Nov. 29, 2011 (JP) .................. 2011-259971

(51) Int. Cl.
C23C 16/24 (2006.01)
C01B 33/035 (2006.01)
C23C 16/52 (2006.01)

(52) U.S. Cl.
CPC .............. *C23C 16/24* (2013.01); *C01B 33/035* (2013.01); *C23C 16/52* (2013.01)

(58) Field of Classification Search
None
See application file for complete search history.

(56) References Cited

U.S. PATENT DOCUMENTS

| 4,426,408 A | 1/1984 | Dietze |
| 2003/0150378 A1* | 8/2003 | Winterton et al. ............. 117/87 |

(Continued)

FOREIGN PATENT DOCUMENTS

| CN | 101815671 A | 8/2010 |
| DE | 27 27 305 A1 | 1/1979 |

(Continued)

OTHER PUBLICATIONS

Office Action issued on Dec. 16, 2014 in the corresponding Japanese Patent Application No. 2011-259971.

(Continued)

*Primary Examiner* — Joseph Miller, Jr.
(74) *Attorney, Agent, or Firm* — Oblon, McClelland, Maier & Neustadt, L.L.P.

(57) ABSTRACT

The present invention provides a method of producing polycrystalline silicon in which silicon is precipitated on a silicon core wire to obtain a polycrystalline silicon rod. In an initial stage (former step) of a precipitation reaction, a reaction rate is not increased by supplying a large amount of source gas to a reactor but the reaction rate is increased by increasing a concentration of the source gas to be supplied, and in a latter step after the former step, the probability of occurrence of popcorn is reduced using an effect of high-speed forced convection caused by blowing the source gas into the reactor at high speed. Thus, a high-purity polycrystalline silicon rod with little popcorn can be produced without reducing production efficiency even in a reaction system with high pressure, high load, and high speed.

16 Claims, 2 Drawing Sheets

(56) References Cited

U.S. PATENT DOCUMENTS

| | | | |
|---|---|---|---|
| 2010/0219380 A1* | 9/2010 | Hertlein et al. | 252/500 |
| 2011/0052914 A1 | 3/2011 | Urushihara et al. | |
| 2011/0274926 A1* | 11/2011 | Oda et al. | 428/378 |
| 2012/0201976 A1 | 8/2012 | Netsu et al. | |

FOREIGN PATENT DOCUMENTS

| | | |
|---|---|---|
| JP | 55 15999 | 2/1980 |
| JP | 11 043317 | 2/1999 |
| JP | 2003 128492 | 5/2003 |
| JP | 2010 180078 | 8/2010 |
| JP | 2010 540395 | 12/2010 |
| JP | 2011-37699 A | 2/2011 |
| JP | 2011 68553 | 4/2011 |
| JP | 2011 084419 | 4/2011 |

OTHER PUBLICATIONS

International Search Report Issued Feb. 26, 2013 in PCT/JP12/007674 Filed Nov. 29, 2012.
Office Action and Search Report dated Jul. 2, 2015 issued in corresponding Chinese patent application No. 201280058859.7.
Extended European Search Report issued Aug. 5, 2015 in Patent Application No. 12852947.6.

* cited by examiner

PRODUCTION METHOD FOR POLYCRYSTALLINE SILICON, AND REACTOR FOR POLYCRYSTALLINE SILICON PRODUCTION

CROSS REFERENCE TO RELATED APPLICATIONS

The present application is a 35 U.S.C. §371 national stage patent application of International patent application PCT/JP2012/007674, filed on Nov. 29, 2012, published as WO/2013/080556 on Jun. 6, 2013, the text of which is incorporated by reference, and claims the benefit of the filing date of Japanese application no. 2011-259971, filed on Nov. 29, 2011, the text of which is also incorporated by reference.

TECHNICAL FIELD

The present invention relates to a technique for producing polycrystalline silicon, and more particularly to a method of producing a polycrystalline silicon rod by supplying a source gas to a surface of a heated silicon core wire to precipitate the polycrystalline silicon using the Siemens method, and a reactor.

BACKGROUND ART

The Siemens method is known as a method of producing polycrystalline silicon used as a feedstock of monocrystalline silicon for a semiconductor or silicon for a solar cell. The Siemens method is a method of bringing a source gas containing chlorosilane into contact with a heated silicon core wire and thereby growing polycrystalline silicon on a surface of the silicon core wire in a vapor phase using a CVD (Chemical Vapor Deposition) method.

When polycrystalline silicon is grown in a vapor phase using the Siemens method, silicon core wires are assembled into a guard frame shape consisting of the two wires in a vertical direction and one wire in a horizontal direction in a reaction space constituted by an upper structure referred to as a bell jar and a lower structure referred to as a base plate (bottom plate), and both ends of the silicon core wires of the guard frame shape are secured on a pair of metal electrodes placed on the base plate through a pair of core wire holders made of carbon. A supply port of a source gas and an exhaust port of a reaction exhaust gas are also placed on the bottom plate. Such a configuration is disclosed in, for example, Japanese Patent Laid-Open No. 2011-68553 (Patent Literature 1).

Generally, several tens of silicon core wires of a guard frame shape that are secured to a pair of metal electrodes placed on a bottom plate are provided in a reactor, and arranged in a multi-ring form. In recent years, it has been desired to obtain a larger amount of polycrystalline silicon in one batch with increasing demand of polycrystalline silicon. This causes the tendency to increase a size of a reactor, and increase the number of silicon core wires arranged in the reactor. These points are disclosed in detail in Japanese Patent Laid-Open No. 2003-128492 (Patent Literature 2).

However, increasing the number of silicon core wires provided in the reactor to increase an amount of production per batch makes it difficult to stably supply a source gas to a surface of the silicon core wire (a surface of a polycrystalline silicon rod). Unstable supply of the source gas easily causes irregularities referred to as "popcorn" in the surface of the silicon rod, and results in differences in diameter (thickness) of the silicon rod of, for example, 1 mm to 5 mm in a length direction and a defect of shape.

Also, a surface area of each irregularity (each kernel) is 20 $mm^2$ to 200 $mm^2$, but a crack-like clearance (so-called void) reaching the inside of the silicon rod may be created between kernels. Polycrystalline silicon is washed before shipment, and a washing agent entering the clearance is hardly removed, thereby significantly reducing washing efficiency. Further, the clearance in the polycrystalline silicon prevents uniform melting in a growing process of silicon monocrystalline.

In order to prevent occurrence of such popcorn, Patent Literature 2 described above proposes a method of increasing a supply amount of a source gas as a surface area of a silicon rod increases with progression of a precipitation reaction to maintain a temperature of a silicon rod surface within a certain range over the entire period of the precipitation reaction, and maintain a constant concentration of a silicon feedstock on the silicon rod surface.

Japanese Patent Laid-Open No. 11-43317 (Patent Literature 3) proposes a method of once significantly reducing a surface temperature of a silicon rod when a crystal grain having a large diameter is easily generated, and controlling a precipitation condition so that only a crystal grain having a small diameter is generated.

There is also a proposal to prevent generation of a crystal grain having a large diameter by gradually reducing a reaction temperature set at the start of a precipitation reaction, although the proposal relates to an extremely early study in the times when a polycrystalline silicon rod was produced using a single silicon core wire (Patent Literature 4: Japanese Patent Laid-Open No. 55-15999).

CITATION LIST

Patent Literature

[Patent Literature 1] Japanese Patent Laid-Open No. 2011-68553
[Patent Literature 2] Japanese Patent Laid-Open No. 2003-128492
[Patent Literature 3] Japanese Patent Laid-Open No. 11-43317
[Patent Literature 4] Japanese Patent Laid-Open No. 55-15999

SUMMARY OF INVENTION

Technical Problem

As described above, several measures to prevent occurrence of popcorn have been proposed, but it has become difficult to apply conventional methods under the tendency to increase the size of a reactor and increase the number of silicon core wires arranged in the reactor.

For example, in a state where many silicon core wires are arranged in a reactor, it is extremely difficult to perform an operation of significantly reducing the surface temperature of the silicon rod during a precipitation step for each silicon core wire as proposed in Patent Literature 3.

Also, in the case where a precipitation reaction is performed under pressure close to atmospheric pressure, it is considered that mass transfer on the silicon rod surface is mainly by a flow of a source gas caused by natural convection, and thus a condition can be controlled so as to prevent occurrence of popcorn. However, in recent years, a precipitation reaction tends to be increased in pressure and speed, and pressure in a reactor is higher than that in the conventional cases, a larger amount of source gas is supplied, and mass transfer on a silicon rod surface is governed by natural convection and also forced convection. A methodology of controlling a condition to prevent occurrence of popcorn in such a reaction system has not yet been proposed.

The present invention is achieved in view of such problems, and has an object to propose a technique for stably producing a high-purity polycrystalline silicon rod with reduced occurrence of popcorn even in a reaction system with high pressure, high load, and high speed.

Solution to Problem

To achieve the object, a method of producing polycrystalline silicon according to the present invention is a method of producing polycrystalline silicon using a Siemens method, including: a former step with a relatively low gas supply amount; a latter step with a relatively high gas supply amount; and an intermediate step with a gas supply amount being increased from a value in the former step to a value in the latter step, in supplying a source gas containing a chlorosilanes gas and a hydrogen gas from a nozzle port into a reactor to precipitate polycrystalline silicon on a silicon core wire, wherein the three steps are all performed at a reaction temperature of 900° C. to 1250° C. and under reaction pressure of 0.3 to 0.9 MPa, a flow rate at the nozzle port is 150 m/sec or more in supplying the gas in a maximum source gas supply amount in the latter step, and supply of the gas and a silicon rod temperature are controlled under the following conditions A to C depending on a diameter D of the polycrystalline silicon rod that changes with progression of a precipitation reaction after a reaction start:

the condition A (a supply amount of the chlorosilanes gas): the chlorosilanes gas is supplied in an amount one third of a maximum chlorosilanes gas supply amount until a predetermined value $D_1$ of 15 mm to 40 mm is reached, the supply amount is increased continuously or stepwise until the maximum chlorosilanes gas supply amount is reached between when the $D_1$ is reached and when a predetermined value $D_2$ of 15 mm to 40 mm and larger than the $D_1$ is reached, and the maximum chlorosilanes gas supply amount is maintained after the $D_2$ is exceeded;

the condition B (a supply amount of the hydrogen gas): the hydrogen gas is supplied so that a chlorosilanes gas concentration in the source gas is 30 mol % to less than 40 mol % until the $D_1$ is reached, a ratio of the supply amount of the hydrogen gas to the chlorosilanes gas is increased continuously or stepwise after the $D_1$ is reached, and the hydrogen gas is supplied so that the chlorosilanes gas concentration in the source gas is 15 mol % to less than 30 mol % after the $D_2$ is reached; and the condition C (a silicon rod temperature): the temperature is reduced with increasing diameter of the silicon rod after the $D_2$ is reached.

Preferably, a range of reduction of the silicon rod temperature under the condition C is set to 50° C. to 350° C.

Also, preferably, an operation of increasing the ratio of the supply amount of the hydrogen gas to the chlorosilanes gas under the condition B is performed before the diameter of the silicon rod reaches 40 mm.

Further, preferably, surface temperatures of a bell jar and a base plate in the reactor at the reaction start are controlled to 40° C. or more.

A reactor for producing polycrystalline silicon according to the present invention is a reactor for producing polycrystalline silicon using the Siemens method, including: a coolant circulation path for controlling surface temperatures of a bell jar and a base plate; and a coolant temperature control unit that can control a temperature of a coolant flowing through the coolant circulation path to 40° C. to 90° C.

Advantageous effects of Invention

According to the present invention, in the method of producing polycrystalline silicon in which silicon is precipitated on a silicon core wire to obtain a polycrystalline silicon rod, in an initial stage (former step) of a precipitation reaction, a reaction rate is not increased by supplying a large amount of source gas to a reactor but the reaction rate is increased by increasing a concentration of the source gas to be supplied, and in a latter step after the former step, the probability of occurrence of popcorn is reduced using an effect of high-speed forced convection caused by blowing the source gas into the reactor at high speed. Thus, a high-purity polycrystalline silicon rod with little popcorn can be produced without reducing production efficiency even in a reaction system with high pressure, high load, and high speed.

DESCRIPTION OF EMBODIMENT

Now, an embodiment for carrying out the present invention will be described with reference to the drawings.

Figure 1:
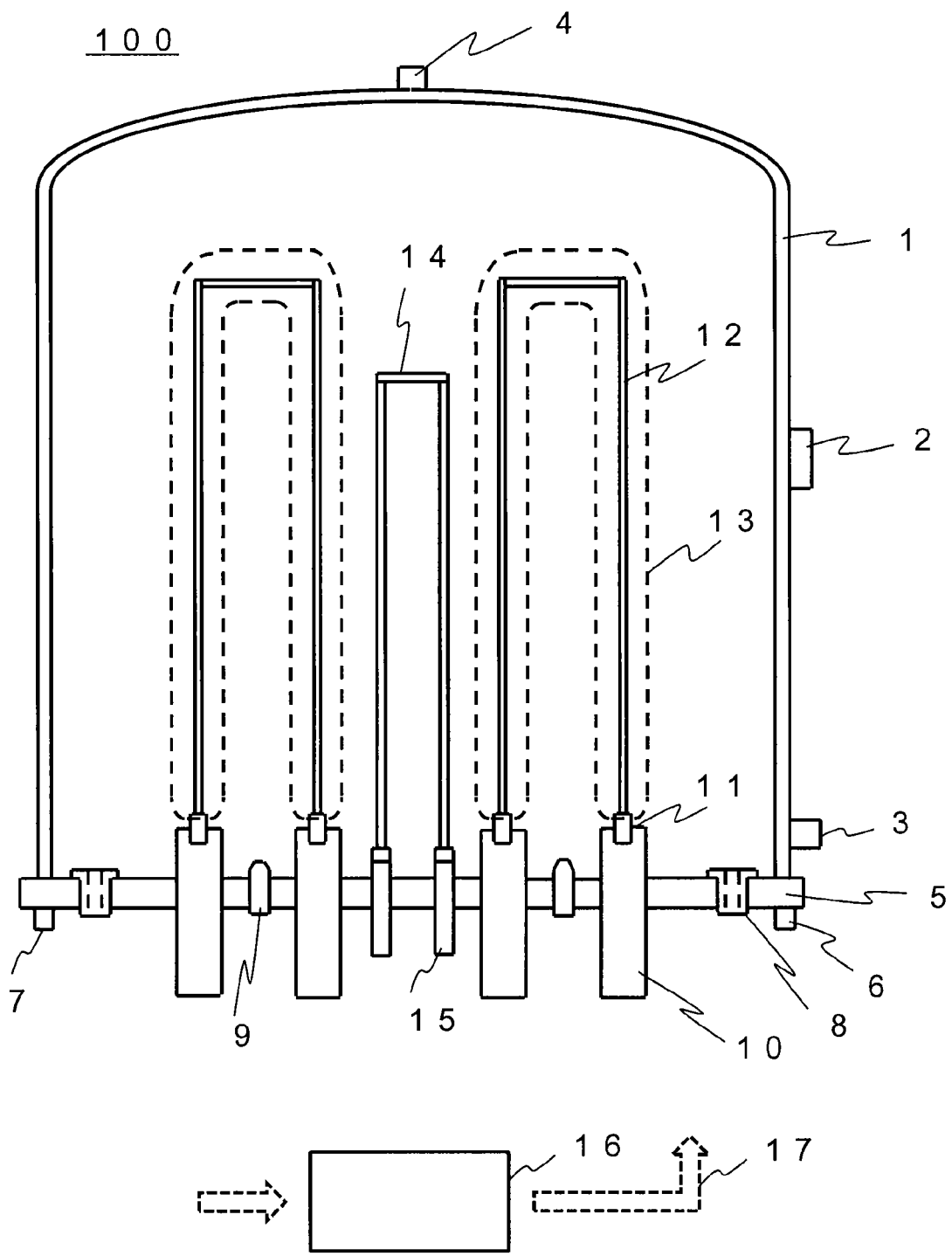
FIG. 1 is a schematic sectional view illustrating an exemplary configuration of a reactor for producing polycrystalline silicon according to the present invention.

FIG. 1 is a schematic sectional view showing an example of a configuration of a reactor 100 for producing polycrystalline silicon according to the present invention. The reactor 100 is a device for growing polycrystalline silicon on a surface of a silicon core wire 12 in a vapor phase using the Siemens method to obtain a polycrystalline silicon rod 13, and includes a base plate 5 and a bell jar 1. A preferable reactor 100 for high efficiency in producing polycrystalline silicon includes a base plate 5 having a diameter of about 1 to 3 m and a bell jar 1 having a height of about 1.5 to 3.5 m.

On the base plate 5, a metal electrode 10 for supplying a current to the silicon core wire 12, a source gas supply nozzle 9 for supplying a trichlorosilane gas as a silicon feedstock and nitrogen or hydrogen as a carrier gas, and a reaction exhaust gas outlet 8 for exhausting the gas to the outside are provided. Also, on the base plate 5, an electrode 15 for supplying a current to a carbon heater 14 for heating the silicon core wire is provided.

In FIG. 1, only two silicon core wires 12 are shown, but in a reactor for mass production, about 8 to 100 silicon core wires are arranged. Also, the source gas supply nozzle 9 and the reaction exhaust gas outlet 8 may be arranged in various manners.

In the bell jar 1, a temperature controlling medium inlet 3 and a temperature controlling medium outlet 4 for circulating a temperature controlling medium (coolant) are provided. The temperature controlling medium (coolant) is circulated to prevent a chlorosilanes gas from being liquefied due to too low an inner surface temperature at start of a precipitation reaction of polycrystalline silicon, and prevent the bell jar 1 from being a metal contamination source due to too high an inner surface temperature during the precipitation reaction. An observation hole 2 for visually checking the inside is provided in a side surface of the bell jar 1. Also in the base plate 5, a temperature controlling medium inlet 6 and a temperature controlling medium outlet 7 are provided for the same purpose as described above.

On top of the metal electrode 10, a core wire holder 11 made of carbon for securing the silicon core wire 12 is provided. When the silicon core wire 12 is energized, a surface temperature of the silicon core wire 12 reaches 900° C. to 1250° C. that is a precipitation temperature of the polycrystalline silicon due to self-heating. The source gas is supplied to the surface of the silicon core wire 12 to precipitate the polycrystalline silicon, thereby obtaining a polycrystalline silicon rod.

The base plate 5 has a disk shape, and a metal electrode 10, a source gas supply nozzle 9, and a reaction exhaust gas outlet 8 are often concentrically provided on the base plate 5. The source gas is often a mixture of trichlorosilane and hydrogen.

The silicon core wire 12 is heated by radiation heat from a carbon heater 14 and reduced in electrical resistivity. Previously reducing the electrical resistivity of the silicon core wire 12 reduces load in initial energization. After the initial energization, the surface is maintained at a predetermined temperature due to the self-heating of the silicon core wire 12, and a reaction of the source gas containing the chlorosilane and the hydrogen gas supplied from the source gas supply nozzle 9 causes precipitation of the polycrystalline silicon on the silicon core wire 12.

The present invention provides a technique for producing polycrystalline silicon for obtaining a high-purity polycrystalline silicon rod with reduced occurrence of popcorn in a precipitation reaction of polycrystalline silicon using the Siemens method with a high pressure, high load, and high speed reaction. In a conventional method, a reaction is performed under pressure close to atmospheric pressure, and polycrystalline silicon is precipitated under a reaction condition such that movement of a silicon feedstock can be approximated by natural convection, while the present invention is directed to a precipitation reaction of polycrystalline silicon using the Siemens method with high pressure and high load. In the precipitation reaction of polycrystalline silicon using the Siemens method with a high pressure, high load, and high speed reaction, for example, reaction pressure is high at 0.3 to 0.9 MPa, and a silicon feedstock of $1.0 \times 10^{-7}$ mol/sec/mm$^2$ or more at maximum is supplied per unit surface area of the silicon rod.

In the reaction under the condition of the high pressure, high load, and high speed reaction, a source gas supply amount (the sum of supply amounts of a silicon source gas and a carrier gas) is increased, and thus forced convection of the source gas blown out from the source gas supply nozzle 9 can be used as one of effective factors for reducing occurrence of popcorn. Specifically, in the reaction under the condition of the high pressure, high load, and high speed reaction, both of the natural convection and the forced convection of the source gas can be taken into consideration in thinking about mass transfer for reducing occurrence of popcorn.

The natural convection refers to an upward current naturally generated by a temperature difference between the silicon rod 13 and the reaction gas in the reactor 100. The forced convection refers to a flow of a reactive gas generated in the reactor 100 by the source gas blown out from the source gas supply nozzle 9 at high speed. Specifically, in the high pressure, high load, and high speed reaction in which a large amount of source gas with high pressure is supplied into the reactor, kinetic energy of the source gas is used to stir the gas in the reactor, and forced convection caused thereby can increase efficiency of mass transfer on the surface of the silicon rod 13, and increase a reaction rate. This can increase a precipitation rate of the polycrystalline silicon and increase productivity.

In the method of producing polycrystalline silicon according to the present invention, to increase the forced convection effect described above, when the supply amount of the source gas containing the chlorosilanes gas and the hydrogen gas supplied from the source gas supply nozzle 9 reaches maximum, a condition is set that a flow rate at the nozzle port of the source gas blown out from the source gas supply nozzle 9 is 150 m/sec or more. Such condition setting can be achieved by, for example, shape design of the source gas supply nozzle 9 and supply pressure control of the source gas. Condition setting depending on the size and shape of the reactor 100 is required for the entire reactor 100 to be a forced convection region. For example, designing the placement of the source gas supply nozzle 9 and the reaction exhaust gas outlet 8 so that a retention time of the gas in the furnace is 20 to 100 seconds provides a preferable retention state.

The reaction rate in precipitating silicon on the surface of the monocrystalline silicon substrate depends on a constant determined by the reaction temperature and the type of chlorosilane as the source gas, and a source gas concentration on the substrate surface. Silicon is precipitated on the polycrystalline silicon rod surface basically in the same manner as described above. In addition, a concentration of chlorosilanes on the silicon rod surface depends on a mass transfer amount in a concentration boundary layer and a source gas concentration (bulk gas concentration) outside the concentration boundary layer.

According to the authors' experimental result, the occurrence of popcorn depends on a multitude relation between a reaction rate ($v_R$) determined by a concentration of chlorosilanes on the surface of the silicon rod 13 and the surface temperature of the silicon rod 13, and an amount of chlorosilanes subjected to mass transfer through the concentration boundary layer to the surface of the silicon rod 13 (that is, a mass transfer rate ($v_T$)).

Specifically, as a qualitative tendency, if the reaction rate ($v_R$) exceeds the mass transfer rate ($v_T$), popcorn easily occurs. On the other hand, if the mass transfer rate ($v_T$) exceeds the reaction rate ($v_R$), popcorn hardly occurs. It can be understood that this experimental result shows that if chlorosilanes as a silicon feedstock are insufficient on the surface of the silicon rod 13, popcorn easily occurs, while if chlorosilane is excessive on the surface of the silicon rod 13, popcorn hardly occurs.

Such understanding is consistent with a basic mechanism of the method disclosed in Patent Literature 2, that is, a method of increasing a source gas concentration (bulk gas concentration) to increase a concentration difference between the outside of the concentration boundary layer and the source gas on the surface of the silicon rod 13, thereby increasing a mass transfer amount through the concentration boundary layer and reducing occurrence of popcorn.

The above described understanding is also consistent with a basic mechanism of the method disclosed in Patent Literature 3, that is, a method in which an operation of reducing a precipitation temperature reduces occurrence of popcorn. The reaction rate depends on a reaction rate constant of the source gas determined by the temperature and the concentration of the source gas on the surface of the silicon rod 13. Thus, the reaction rate increases with increasing reaction temperature and the reaction rate decreases with decreasing reaction temperature. Thus, an operation of reducing the precipitation temperature reduces the reaction rate, and the operation of reducing the precipitation temperature is effective for reducing occurrence of popcorn.

It can be considered that a thickness of the concentration boundary layer is simply proportional to a thickness of a rate boundary layer determined by the natural convection and the forced convection on the surface of the silicon rod 13. Thus, when the flow rate of the reaction gas near the surface of the silicon rod 13 is reduced, and the thickness of the rate boundary layer is increased, the thickness of the concentration boundary layer is increased, and the mass transfer amount through the concentration boundary layer is reduced even at a constant bulk gas concentration. On the other hand, if the gas flow rate near the surface of the silicon rod 13 is increased, a thickness of a concentration diffusion layer is reduced to increase the mass transfer rate. Thus, it can be considered that if the gas flow rate near the surface of the silicon rod 13 is increased and the mass transfer rate exceeds the reaction rate on the surface of the silicon rod 13, popcorn hardly occurs. Specifically, in addition to the natural convection caused by the temperature difference between the silicon rod 13 and the reaction gas therearound, the forced convection caused by supply of a large amount of source gas is used to increase the gas flow rate more and more, and then popcorn should hardly occur on the surface of the silicon rod 13 even at the same reaction temperature.

Under the high pressure, high load, and high speed reaction condition, high-speed forced convection can be obtained by blowing the source gas into the reactor at high speed, and the effect of the high-speed forced convection can be used to reduce the probability of occurrence of popcorn even in a precipitation reaction at high temperature.

However, the silicon core wire 12 to be used is elongated and has a rectangular section, about 5 to 10 mm on a side, and a length of about 1500 to 3000 mm. Thus, if the source gas containing the chlorosilanes gas and the hydrogen carrier gas is blown in a large flow amount into the reactor at high speed with the diameter of the silicon rod 13 being insufficiently large, the silicon core wire 12 or the silicon rod 13 may collapse. Thus, in an actual production site, a method in which the forced convection is efficiently used to increase efficiency of the mass transfer on the surface of the silicon rod 13 and increase the reaction rate cannot be used in an initial stage of the precipitation reaction.

Thus, in the present invention, in an initial stage (former step) of the precipitation reaction, a method is used in which a reaction rate is not increased by supplying a large amount of source gas to the reactor 100 but the reaction rate is increased by increasing a concentration of the source gas to be supplied. Specifically, the amount of source gas to be supplied is reduced, while the chlorosilanes concentration in the source gas is increased to 30 mol % to less than 40 mol %, a bulk gas concentration outside the concentration boundary layer is maintained at a high value to increase the mass transfer amount to increase the precipitation rate of silicon.

However, in this case, it is not preferable that an inner wall temperature of the chamber 1 is a dew point or less of the source gas (bulk gas) outside the concentration boundary layer. This is because if the inner wall temperature of the chamber 1 is the dew point or less of the bulk gas, the silicon feedstock is liquefied on an inner wall surface of the chamber 1, which may block an exhaust gas pipe in the reactor 100, cause powder secondarily generated during the precipitation reaction of silicon to adhere to the inner wall of the chamber 1 or an inner wall of the exhaust gas pipe, or reduce performance of a gas heat exchanger attached to the reactor 100.

Thus, the reactor 100 for producing polycrystalline silicon according to the present invention includes a coolant temperature control unit 16 that can control, to 40° C. to 90° C., a temperature of a coolant (temperature controlling medium) 17 flowing through coolant circulation paths (3, 4 and 6, 7) for controlling the inner surface temperatures of the bell jar 1 and the base plate 5.

In order to maintain the inner surface temperatures of the bell jar 1 and the base plate 5 at a higher temperature than a condensation temperature of the silicon source gas, for example, when the silicon source gas is trichlorosilane, a coolant at a temperature of 40° C. or more is circulated in the coolant circulation path.

In the method of producing polycrystalline silicon according to the present invention, the chlorosilanes gas is used as the silicon source gas, and the inner surface temperatures of the bell jar 1 and the base plate 5 in the reactor 100 at the precipitation reaction start are controlled to 40° C. or more.

On the other hand, too high inner surface temperatures of the bell jar 1 and the base plate 5 may cause precipitation of silicon on the surface or metal contamination. Thus, in order to prevent the inner surface temperatures of the bell jar 1 and the base plate 5 from exceeding a predetermined value, for example, when the silicon source gas is trichlorosilane, a coolant at a temperature of 90° C. or less is circulated through the coolant circulation path. The coolant temperature control unit 16 controls the temperature of the coolant, and thus has a function of cooling and warming the coolant. Also, water is typically used as a temperature controlling medium (coolant).

The coolant supplied from the coolant temperature control unit 16 is mainly used for controlling the inner surface temperatures of the bell jar 1 and the base plate 5 during the precipitation reaction, but not limited to this, the coolant may be used for cooling in a step of reducing a temperature in the reactor after finish of the precipitation reaction (cooling step). In such use, it is not always necessary to manage the coolant temperature at 40° C. to 90° C.

Supplying the silicon feedstock with high concentration is advantageous in terms of increasing the speed of the precipitation reaction. However, according to the present inventors' study, continuously supplying the silicon feedstock with high concentration easily generates powder that seems to be vapor phase precipitate secondarily generated by the precipitation reaction of silicon. Such generation of powder is more noticeable with increasing diameter of the silicon rod 13. Such powder adheres to the inner surface of the bell jar 1 to cause heavy metal contamination, or makes it difficult to clean the bell jar 1 and the base plate 5 after the reaction end. The present inventors assume that the powder is generated because the increase in diameter of the silicon rod 13 causes a local high-temperature region to be easily created, and the silicon feedstock is thermally decomposed in the high-temperature region.

Thus, after the diameter of the silicon rod 13 is increased to some extent, it is necessary to reduce the concentration of the silicon feedstock in the source gas, and supply the source gas under a relatively low concentration condition.

The thickness of the rate boundary layer (that is, the thickness of the concentration boundary layer) on the surface of the silicon rod 13 is increased with increasing diameter of the silicon rod 13 at the same gas flow rate around the silicon rod 13. Thus, when the source gas in a constant flow amount is continuously supplied to the reactor 100 and the flow of the forced convection is constant in the reactor, the increase in the diameter of the silicon rod 13 increases the thickness of the concentration boundary layer to reduce the mass transfer amount. If a constant reaction temperature is maintained in this state, popcorn easily occurs.

The above described problem is solved by continuously increasing the source gas supply amount with increasing diameter of the silicon rod 13, but the reactor used in actual production generally has a limited supply capacity of the source gas.

Thus, in the present invention, in a step after the diameter of the silicon rod 13 is increased to a predetermined value (latter step), control is performed to reduce the surface temperature of the silicon rod 13. By such temperature control, the reaction rate is reduced below the mass transfer rate in the concentration boundary layer, thereby reducing occurrence of popcorn.

Setting the precipitation reaction condition in view of the above described phenomenon can reduce occurrence of popcorn even when the polycrystalline silicon is precipitated by a high pressure, high load, and high speed reaction.

Specifically, the method of producing polycrystalline silicon according to the present invention is carried out under the conditions described below.

The method includes: a former step with a relatively low gas supply amount; a latter step with a relatively high gas supply amount; and an intermediate step with a gas supply amount being increased from a value in the former step to a value in the latter step, in supplying a source gas containing a chlorosilane gas and a hydrogen gas from a nozzle port into a reactor to precipitate polycrystalline silicon on a silicon core wire by the Siemens method, and the three steps are all performed at a reaction temperature of 900° C. to 1250° C. and under reaction pressure of 0.3 to 0.9 MPa. A flow rate at the nozzle port is 150 m/sec or more in supplying the gas in a maximum source gas supply amount in the latter step, and supply of the gas and a silicon rod temperature are controlled under conditions A to C depending on a diameter D of the polycrystalline silicon rod that changes with progression of a precipitation reaction after a reaction start.

Specifically, the chlorosilanes gas is supplied in an amount one third or less of a maximum chlorosilanes gas supply amount until the diameter of the polycrystalline silicon rod reaches a predetermined value $D_1$ of 15 mm to 40 mm, the supply amount is increased continuously or stepwise until the maximum chlorosilanes gas supply amount is reached between when $D_1$ is reached and when a predetermined value $D_2$ of 15 mm to 40 mm and larger than $D_1$ is reached, and the maximum chlorosilanes gas supply amount is maintained after $D_2$ is exceeded (condition A).

Also, the hydrogen gas is supplied so that a chlorosilanes gas concentration in the source gas is 30 mol % to less than 40 mol % until the diameter of the polycrystalline silicon rod reaches $D_1$, a ratio of the supply amount of the hydrogen gas to the chlorosilanes gas is increased continuously or stepwise after $D_1$ is reached, and the chlorosilanes gas concentration in the source gas is 15 mol % to less than 30 mol % after $D_2$ is reached (condition B).

Further, the temperature of the silicon rod is reduced with increasing diameter of the silicon rod after the diameter of the polycrystalline silicon rod reaches $D_2$.

The former step with a relatively low gas supply amount is provided because if a large amount of source gas is supplied in a stage where the silicon rod is relatively thin, the silicon core wire 12 may entirely collapse. A generally used silicon core wire 12 is of a prism having a rectangular section, 6 mm to 8 mm on a side, or a cylinder having a diameter of a section of 6 mm to 8 mm.

On the other hand, the flow rate at the nozzle port of the source gas supply nozzle 9 is 150 m/sec or more in supplying the gas in a maximum source gas supply amount in the latter step with a relatively high gas supply amount in order to efficiently obtain forced convection.

In the supply of the source gas in the initial stage of the reaction, the flow rate at the nozzle port is restricted as described later so that blowing pressure of the source gas does not cause trouble such as collapse or blowing away of the silicon core wire 12 at the reaction start.

In order to increase the precipitation reaction rate of silicon in a state where the supply flow rate of the source gas is low and a forced gas circulation flow is not formed in the reactor 100, a high bulk gas concentration of chlorosilanes needs to be maintained in the reactor 100. Thus, in the present invention, the chlorosilanes gas concentration in the source gas supplied in the former step is increased under the above described condition.

Specifically, the gas is supplied so that the chlorosilanes gas concentration in the source gas is 30 mol % to less than 40 mol % until the diameter of the polycrystalline silicon rod reaches $D_1$ that is a predetermined value of 15 mm to 40 mm. More preferably, the chlorosilanes gas concentration in the source gas is 30 mol % to less than 35 mol %. Within such a concentration, liquefaction or generation of powder does not occur in the reactor 100.

In the stage where the diameter of the silicon rod 13 is small, a local high-temperature region is hardly created, and powder is hardly generated. Thus, no problem occurs in maintaining a high chlorosilanes gas concentration in the source gas. Thus, a relatively high reaction temperature of 1000° C. to 1250° C. can be maintained. By setting a relatively high reaction temperature, the precipitation rate can be relatively increased by natural convection and an increase in concentration difference diffusion amount even in the former step in which promotion of mass transfer on the surface of the silicon rod 13 by forced convection caused by the supply of the source gas cannot be expected.

As described above, in all of the former step with a relatively low gas supply amount; the latter step with a relatively high gas supply amount; and the intermediate step with a gas supply amount being increased from a value in the former step to a value in the latter step, the reaction temperature is 900° C. to 1250° C., and reaction pressure is 0.3 to 0.9 MPa. When the pressure in the furnace is maintained at a predetermined value, the pressure is preferably maintained within a range of ±20%. For example, when the predetermined value is 0.5 MPa, the pressure is preferably maintained at 0.4 to 0.6 MPa. When the reaction temperature (surface temperature of the silicon rod) is maintained at a predetermined value, the temperature is maintained within a range of ±20° C. For example, when the surface temperature of the silicon core wire 12 at the reaction start is 1200° C., the temperature is preferably maintained within the range of 1200±20° C.

Figure 2:
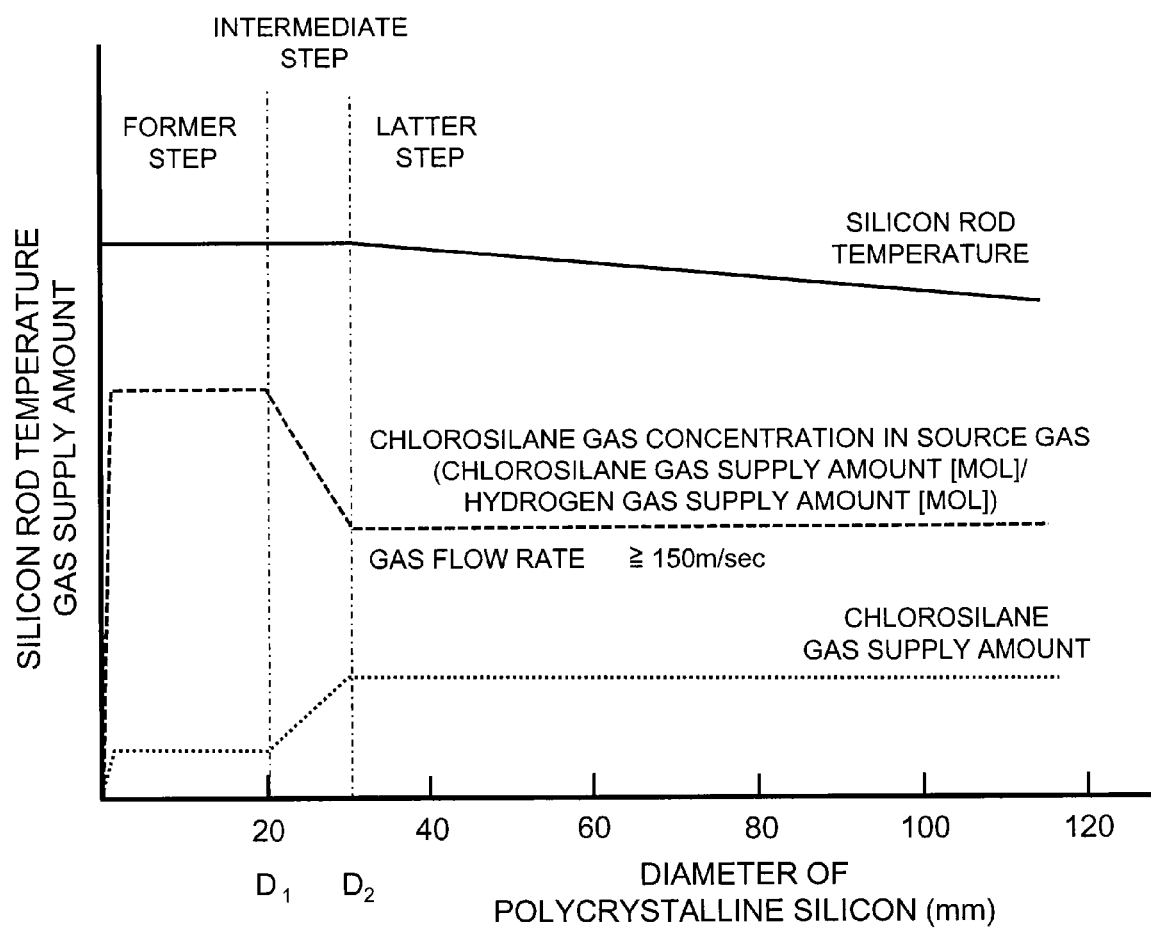
FIG. 2 is a sequence diagram illustrating an example of a process for producing polycrystalline silicon according to the present invention.

FIG. 2 is a sequence diagram illustrating an example of a process for producing polycrystalline silicon according to the present invention, and exemplifying a silicon rod temperature, a chlorosilanes gas concentration (a ratio between a chlorosilanes gas supply amount and a hydrogen gas supply amount (mol/mol)) in the source gas, and the chlorosilanes gas supply amount in the former to latter steps. A chlorosilane gas is used as the chlorosilanes gas, and $D_1$ and $D_2$ mentioned above are 20 mm and 30 mm, respectively.

As described, in the present invention, the supply flow rate of the source gas is controlled until the diameter of the silicon rod 13 is increased to at least 15 mmφ and the silicon rod 13 hardly collapses due to blowing pressure of the source gas. In order to increase the diameter as quick as possible, a supply amount of the chlorosilanes gas is preferably one tenth or more, and more preferably one sixth or more of a maximum supply amount. However, as described above, an upper limit is preferably one third or less, and more preferably one fourth of the maximum supply amount to prevent collapse. In this case, the supply amount of the chlorosilanes gas may be increased within the above described range during the step.

The diameter ($D_2$ described above) of the silicon rod 13 with which there is no longer risk of collapse of the silicon rod 13 is generally smaller than 40 mm$\phi$ although it depends on a device configuration. After the diameter is reached, it is preferable that chlorosilane is supplied in the maximum supply amount, and the maximum supply amount is maintained until a reaction end operation. In this case, concentration is managed as described above with the chlorosilanes concentration in the source gas being a bulk concentration, a larger supply amount of the source gas can more quickly increase the thickness of the silicon rod 13. Thus, the supply amount of chlorosilanes is not controlled in a minimum amount until the diameter is reached with which there is no longer risk of collapse of the silicon rod 13, but is increased stepwise and/or continuously with increasing thickness of the silicon rod. Specifically, $D_1$ and $D_2$ are set to 15 mm$\phi$ to 40 mm$\phi$, the chlorosilane supply amount is increased stepwise and/or continuously after $D_1$ is exceeded to reach $D_2$ as a maximum value. The diameter of the silicon rod 13 can be calculated from measurement data of the silicon rod temperature and a resistance value obtained from energization data.

On the other hand, the hydrogen gas is supplied in an amount according to the chlorosilanes gas supply amount so as to maintain the above described chlorosilanes concentration in the source gas at least until the diameter of the silicon rod 13 reaches 15 mm$\phi$. Then, at any period or time after the diameter of the silicon rod 13 exceeds 15 mm$\phi$ and before the diameter exceeds 70 mm$\phi$, the supply amount ratio of the hydrogen gas to the chlorosilanes gas is increased continuously and/or in one or more steps. After the diameter of the silicon rod 13 reaches 70 mm$\phi$, the chlorosilanes concentration in the source gas is managed to be 15 mol % to less than 30 mol %, preferably 20 mol % to 25 mol %.

The supply amount ratio of the hydrogen gas is increased according to increasing timing of the chlorosilanes gas, so that the increase is completed when the diameter of the silicon rod 13 reaches 15 to 40 mm$\phi$ and there is no longer risk of collapse of the silicon rod 13 due to blowing pressure of the source gas, and the supply amount of the chlorosilanes gas reaches maximum.

The increase in the hydrogen gas supply amount reduces the bulk concentration of the chlorosilanes, and thus a reaction under a concentration condition with as high a bulk concentration as possible provides higher productivity. However, the increase in thickness of the silicon rod increases the possibility of generation of powder under the high concentration condition. Thus, in order to reduce occurrence of popcorn and reduce generation of powder, the concentration is preferably reduced in the stage when the chlorosilanes gas supply amount reaches maximum.

The supply amounts of the chlorosilanes gas and the hydrogen gas that constitute the source gas are increased continuously or in one or more steps as described above, but the temperature of the silicon rod 13 needs to be controlled to a temperature suitable for the reaction. Thus, an energization amount to the silicon rod 13 is increased to control the temperature when a cooling amount is increased with increasing supply amount of the source gas. The temperature of the source gas in the furnace is preferably about 200° C. to 700° C. except near the source gas supply nozzle 9 and the silicon rod 13. Thus, the supply rate needs to be increased within a range that allows temperature control, and also in this sense, the supply rate is not increased once, but is preferably increased in multiple steps or continuously.

The chlorosilanes gas supply amount and the hydrogen gas supply amount are increased as described above, and thus the flow rate of the source gas blown out from the nozzle port of the source gas supply nozzle 9 is 150 m/sec or more, thereby obtaining the forced convection effect as described above. Thus, even if the supply ratio of the hydrogen gas to the chlorosilanes gas is increased and the bulk gas concentration is reduced to prevent generation of powder and prevent occurrence of popcorn, the effect of reducing the thickness of the concentration boundary layer allows polycrystalline silicon to be produced without significantly reducing production efficiency of polycrystalline silicon.

Further in the present invention, the temperature of the silicon rod 13 is controlled to prevent occurrence of popcorn. Specifically, from any time between when the increase in the hydrogen gas supply amount is completed and the supply of the source gas at a highest rate is started and when the diameter of the silicon rod reaches 70 mm$\phi$ at the latest to the reaction end, an operation of reducing the temperature of the silicon rod 13 is performed to prevent occurrence of popcorn. With increasing diameter of the silicon rod 13, an operation of gradually reducing the precipitation temperature in order to reduce the reaction amount by a decrement of the mass transfer amount on the surface of the silicon rod 13, thereby reducing occurrence of popcorn.

Starting the operation of reducing the temperature at a later time can increase productivity, but too late start may cause popcorn. The control of the precipitation temperature with respect to the diameter of the silicon rod 13 differs depending on the situation of the reactor, and a pattern of reducing the temperature needs to be determined by several tests using a reactor actually operated. The temperature of the silicon rod 13 is controlled by an energization amount to the silicon rod, and thus an energization amount pattern without occurrence of popcorn may be found by the tests and used for production of the polycrystalline silicon rod.

According to the present inventors' experiment, when a final diameter of the silicon rod at the reaction end is 120 mm$\phi$ to 150 mm$\phi$, a reduction from the highest temperature is preferably 50° C. to 350° C., and particularly 100° C. to 350° C., and a final temperature is preferably 1100° C. to 900° C.

The pattern of reducing the temperature may be a method of continuously changing and reducing the temperature so that the diameter and the temperature are on straight lines when the diameter of the silicon rod between the diameter of the silicon rod at the start of the temperature reduction and an expected final diameter of the silicon rod is taken on the abscissa, and the temperature between the temperature at the start of the temperature reduction and the final temperature is taken on the ordinate.

As a convenient method, two or more points may be provided and the temperature may be reduced stepwise at the points. However, reducing the temperature more than necessary reduces productivity, and too high a temperature increases the risk of generation of powder, and thus the temperature is preferably reduced in three or more steps.

EXAMPLE

Example 1

The reaction device shown in FIG. 1 was used to grow a polycrystalline silicon rod. In the actual device, sixty silicon core wires 12 having a diameter of 7 mm$\phi$ are provided to stand on the base plate 5, and the source gas supply nozzle 9 is placed so that the source gas can be supplied to all the silicon core wires in a required amount. Through a coolant circulation line in the bell jar 1 and the base plate 5 (the coolant inlets 3, 6 and the coolant outlets 4, 7), water managed at 55° C. was circulated from the reaction start to the reaction end.

During the precipitation reaction of polycrystalline silicon, pressure in the reactor was maintained at 0.5 MPa, the temperature of the silicon core wire was set to 1100° C. at the reaction start, and a source gas of 526 kg/hr containing a hydrogen gas and a trichlorosilane gas with a trichlorosilane concentration of 32 mol % (trichlorosilane gas of 510 kg/hr and hydrogen gas of 180 Nm$^3$/hr) was supplied.

Also, supply amounts of the trichlorosilane gas and the hydrogen gas were increased in proportion to the diameter of the silicon rod 13 so that when the diameter of the silicon rod 13 reached 10 mmφ, the trichlorosilane gas supply amount was 1000 kg/hr and the hydrogen gas supply amount was 350 Nm$^3$/hr (the trichlorosilane concentration of 32 mol % was maintained).

Further, the trichlorosilane gas supply amount of 1000 kg/hr and the hydrogen gas supply amount of 350 Nm$^3$/hr were maintained until the diameter of the silicon rod 13 was 10 mmφ to 20 mmφ, and then, until the diameter of the silicon rod 13 reached 30 mmφ, the supply amounts of the trichlorosilane gas and the hydrogen gas were increased in proportion to the diameter of the silicon rod 13 so that when the diameter of the silicon rod 13 reached 30 mmφ, the trichlorosilane gas supply amount was 3000 kg/hr and the hydrogen gas supply amount was 2000 Nm$^3$/hr (a trichlorosilane concentration of 20 mol % in the source gas), and then these supply amounts were maintained until the reaction end. The source gas flow rate at the nozzle port when the source gas supply amount reaches maximum was 180 m/sec.

On the other hand, the temperature of the silicon rod 13 was managed to be maintained at 1100° C. until the diameter of the silicon rod 13 reached 30 mmφ by adjusting an amount of current to be supplied. Then, the temperature was linearly reduced to 1050° C. in proportion to the diameter with increasing diameter of the silicon rod 13 until the diameter of the silicon rod reached 116 mmφ and the reaction was finished.

By the above described process, the silicon rod having a diameter of 116 mmφ was obtained from a silicon core wire of 7 mm in 61 hours without generating silicon powder in the reactor, and productivity of polycrystalline silicon at this time was 43.2 kg/hr.

The obtained sixty silicon rods were crushed into lumps of about 5 cm, and sorted into lumps with popcorn and lumps without popcorn. The ratio of the lumps with popcorn to all the lumps was 5% by mass.

Example 2

For the process in Example 1, only an operation for supplying the source gas and a temperature control pattern of the silicon rod were changed to produce a polycrystalline silicon rod.

In the operation for supplying the source gas, the source gas was supplied in the same pattern as in Example 1 until the diameter of the silicon rod 13 reached 20 mmφ from the reaction start. Then, the supply amount of trichlorosilane was increased in proportion to the diameter of the silicon rod 13 so that the supply amount was 3000 kg/hr when the diameter of the silicon rod 13 reached 25 mmφ, the supply amount of a hydrogen gas was increased in proportion to the diameter of the silicon rod 13 so that the supply amount was 2000 Nm$^3$/hr when the diameter of the silicon rod 13 reached 30 maw, and then these supply amounts were maintained.

On the other hand, the temperature of the silicon rod 13 was managed to be maintained at 1100° C. until the diameter of the silicon rod 13 reached 25 mmφ, and then the temperature was linearly reduced to 990° C. proportionally with increasing diameter of the silicon rod 13 until the diameter of the silicon rod 13 reached 119 mmφ and the reaction was finished.

By the above described process, the silicon rod having a diameter of 119 mmφ was obtained from a silicon core wire of 7 mm in 66 hours without generating silicon powder in the reactor, and productivity of polycrystalline silicon at this time was 42.5 kg/hr.

Also, as in Example 1, the silicon rods were crushed and lumps with popcorn were sorted. The ratio of the lumps with popcorn to all the lumps was 1% by mass.

Comparative Example 1

For the process in Example 1, the total supply amount of the trichlorosilane gas and the hydrogen gas was matched with that in the operation in Example 1, the trichlorosilane concentration from the reaction start to the reaction end was fixed at 20 mol %, and further, the reaction temperature was managed so that the temperature was 1050° C. at the reaction start and 990° C. at the reaction end, and other operations were performed in the same manner as in the process in Example 1.

Specifically, a source gas of 339 kg/hr (the trichlorosilane gas of 320 kg/hr and the hydrogen gas of 210 Nm$^3$/hr) was supplied at the reaction start.

The supply amounts of the trichlorosilane gas and the hydrogen gas were increased in proportion to the diameter of the silicon rod 13 so that the trichlorosilane gas supply amount was 623 kg/hr and the hydrogen gas supply amount was 412 Nm$^3$/hr when the diameter of the silicon rod 13 reached 10 mmφ.

Further, the trichlorosilane gas supply amount of 623 kg/hr and the hydrogen gas supply amount of 412 Nm$^3$/hr were maintained until the diameter of the silicon rod 13 was 10 mmφ to 20 mmφ, and then, until the diameter of the silicon rod 13 reached 30 mmφ, the supply amounts of the trichlorosilane gas and the hydrogen gas were increased in proportion to the diameter of the silicon rod 13 so that when the diameter of the silicon rod 13 reached 30 mmφ, the trichlorosilane gas supply amount was 3000 kg/hr and the hydrogen gas supply amount was 2000 Nm$^3$/hr, and then the trichlorosilane gas supply amount of 3000 kg/hr and the hydrogen gas supply amount of 2000 Nm$^3$/hr were maintained until the reaction end.

By the above described process, the silicon rod having a diameter of 131 mmφ was obtained from a silicon core wire of 7 mm in 97 hours without generating silicon powder in the reactor, but productivity of polycrystalline silicon was reduced to 35.1 kg/hr because the source gas containing trichlorosilane with a low concentration was used from the initial stage of the reaction.

Also, as in Example 1, the silicon rods were crushed and lumps with popcorn were sorted. The ratio of the lumps with popcorn to all the lumps was 2% by mass.

Comparative Example 2

For the process in Example 1, the temperature of the silicon rod was fixed at 1050° C. from the reaction start to the reaction end, and other operations were all performed in the same manner as in the process in Example 1.

By the above described process, the silicon rod having a diameter of 131 mmϕ was obtained from a silicon core wire of 7 mm in 76 hours without generating silicon powder in the reactor, and productivity of polycrystalline silicon was 45.2 kg/hr.

Also, as in Example 1, the silicon rods were crushed and lumps with popcorn were sorted. The ratio of the lumps with popcorn to all the lumps was 26% by mass.

Comparative Example 3

For the process in Example 1, the method of supplying the source gas was performed with the chlorosilane concentration of 20 mol % from the reaction start to the reaction end as in Comparative example 1, the temperature of the silicon rod was fixed at 1100° C. from the reaction start to the reaction end as in Comparative example 2, and other operations were all performed in the same manner as in the process in Example 1.

By the above described process, the silicon rod having a diameter of 132 mmϕ was obtained from a silicon core wire of 7 mm in 73 hours without generating silicon powder in the reactor, and productivity of polycrystalline silicon was 47.5 kg/hr.

Also, as in Example 1, the silicon rods were crushed and lumps with popcorn were sorted. The ratio of the lumps with popcorn to all the lumps was 40% by mass.

Comparative Example 4

For the process in Example 1, the trichlorosilane gas supply amount was matched with that in the operation in Example 1, and the hydrogen gas supply amount was adjusted so that the trichlorosilane concentration in the source gas supplied during the reaction was 32 mol %.

The reaction temperature was increased according to the diameter of the silicon rod so as to reach 1050° C. at the reaction start and 1100° C. when the diameter of the silicon rod reached 30 mmϕ. Then, the temperature was further managed to be reduced according to the diameter of the silicon rod so as to reach 990° C. at the reaction end. Other operations were all performed as in the process in Example 1.

Specifically, the source gas was supplied in the pattern in Example 1 until the diameter of the silicon rod 13 reached 20 mmϕ, then until the diameter of the silicon rod reached 30 mmϕ, the supply amounts of the trichlorosilane gas and the hydrogen gas were increased in proportion to the diameter of the silicon rod 13 so that when the diameter of the silicon rod 13 reached 30 mmϕ, the trichlorosilane gas supply amount was 3000 kg/hr and the hydrogen gas supply amount was 1050 Nm³/hr (the trichlorosilane concentration of 32 mol % in the source gas), and then these supply amounts were maintained until the reaction end. The flow rate of the source gas at the nozzle port when the source gas supply amount reached maximum was 111 m/sec.

When the above described process was used, a large amount of silicon powder was generated in the reactor. Also, the silicon rod having a diameter of 129 mmϕ was obtained from a silicon core wire of 7 mm in 66 hours, and productivity of polycrystalline silicon was 49.5 kg/hr.

Also, as in Example 1, the silicon rods were crushed and lumps with popcorn were sorted. The ratio of the lumps with popcorn to all the lumps was 31% by mass.

The results of Examples and Comparative examples are summarized in Table 1.

TABLE 1

|  | Example 1 | Example 2 | Comparative example 1 | Comparative example 2 | Comparative example 3 | Comparative example 4 |
|---|---|---|---|---|---|---|
| Reaction pressure | 0.5 Mpa | 0.5 Mpa | 0.5 Mpa | 0.5 Mpa | 0.5 Mpa | 0.5 Mpa |
| The number of silicon core wires | 60 | 60 | 60 | 60 | 60 | 60 |
| Bell jar cooling water temperature | 55° C. | 55° C. | 55° C. | 55° C. | 55° C. | 55° C. |
| Base plate cooling water temperature | 55° C. | 55° C. | 55° C. | 55° C. | 55° C. | 55° C. |
| Source silicon gas | SiHCl₃ | SiHCl₃ | SiHCl₃ | SiHCl₃ | SiHCl₃ | SiHCl₃ |
| Former step | | | | | | |
| Concentration of SiHCl₃ in source gas | 32 mol % | 32 mol % | 20 mol % | 32 mol % | 20 mol % | 32 mol % |
| Supply amount of SiHCl₃ at start | 510 kg/hr | 510 kg/hr | 320 kg/hr | 510 kg/hr | 510 kg/hr | 510 kg/hr |
| Initial reaction temperature | 1100° C. | 1100° C. | 1050° C. | 1050° C. | 1100° C. | 1050° C. |
| Terminal reaction temperature | 1100° C. | 1100° C. | 1050° C. | 1050° C. | 1100° C. | 1100° C. |
| Maximum supply amount of SiHCl₃ | 3000 kg/hr | 3000 kg/hr | 3000 kg/hr | 3000 kg/hr | 3000 kg/hr | 3000 kg/hr |
| Average precipitation rate | 9 μm/min | 9 μm/min | 4 μm/min | 7 μm/min | 7 μm/min | 7 μm/min |
| Diameter at maximum SiHCl₃ | 30 mmϕ | 25 mmϕ | 30 mmϕ | 30 mmϕ | 30 mmϕ | 30 mmϕ |
| Latter step | | | | | | |
| Supply amount of SiHCl₃ | 3000 kg/hr | 3000 kg/hr | 3000 kg/hr | 3000 kg/hr | 3000 kg/hr | 3000 kg/hr |
| Concentration of SiHCl₃ in source gas | 20 mol % | 20 mol % | 20 mol % | 20 mol % | 20 mol % | 32 mol % |
| Initial reaction temperature | 1100° C. | 1100° C. | 1050° C. | 1050° C. | 1100° C. | 1100° C. |

TABLE 1-continued

|  | Example 1 | Example 2 | Comparative example 1 | Comparative example 2 | Comparative example 3 | Comparative example 4 |
|---|---|---|---|---|---|---|
| Terminal reaction temperature | 1050° C. | 990° C. | 990° C. | 1050° C. | 1100° C. | 990° C. |
| Average precipitation rate | 17 μm/min | 16 μm/min | 15 μm/min Batch result | 16.5 μm/min | 19.5 μm/min | 19.5 μm/min |
| Powder generation state | Not generated | Not generated | Not generated | Not generated | Not generated | Generated in large amount |
| Percentage of occurrence of popcorn | 5% | 1% | 2% | 26% | 40% | 31% |
| Productivity | 43.2 kg/hr | 42.5 kg/hr | 35.1 kg/hr | 45.2 kg/hr | 47.5 kg/hr | 49.5 kg/hr |

INDUSTRIAL APPLICABILITY

The present invention provides a technique for stably producing a high-purity polycrystalline silicon rod with reduced occurrence of popcorn even in a reaction system with high pressure, high load, and high speed.

REFERENCE SIGNS LIST 100 reactor
1 bell jar
2 observation hole
3 cooling water inlet (bell jar)
4 cooling water outlet (bell jar)
5 base plate
6 cooling water inlet (base plate)
7 cooling water outlet (base plate)
8 reaction exhaust gas outlet
9 source gas supply nozzle
10 electrode
11 core wire holder
12 silicon core wire
13 polycrystalline silicon rod
14 carbon heater
15 electrode
16 coolant temperature control unit
17 coolant

The invention claimed is:

1. A method of producing polycrystalline silicon by a Siemens method, comprising:
    supplying a source gas comprising a chlorosilane gas and a hydrogen gas from a nozzle port into a reactor, and reacting the source gas to precipitate polycrystalline silicon on a silicon core wire,
    wherein:
    the source gas is initially supplied at a first gas supply amount, then supplied at a second gas supply amount, then supplied at a third gas supply amount greater than the first gas supply amount, wherein the second gas supply amount increases from a value of the first gas supply amount to a value of the third gas supply amount;
    the reacting is performed at a reaction temperature of 900° C. to 1250° C. and under a reaction pressure of 0.3 to 0.9 MPa;
    a flow rate at the nozzle port is 150 m/sec or more when the source gas is supplied at the third gas supply amount, and
    the supplying of the source gas and a silicon rod temperature are controlled under the following conditions A to C depending on a diameter D of a polycrystalline silicon rod that changes with progression of a precipitation reaction after a reaction start:
    condition A: the chlorosilane gas is supplied in an amount one third or less of a maximum chlorosilane gas supply amount until a predetermined value $D_1$ of 15 mm to 40 mm is reached, the supply amount is increased continuously or stepwise until the maximum chlorosilane gas supply amount is reached between when the $D_1$ is reached and when a predetermined value $D_2$ of 15 mm to 40 mm and larger than the $D_1$ is reached, and the maximum chlorosilane gas supply amount is maintained after the $D_2$ is exceeded;
    condition B: the hydrogen gas is supplied so that a chlorosilane gas concentration in the source gas is 30 mol % to less than 40 mol % until the $D_1$ is reached, a ratio of the supply amount of the hydrogen gas to the chlorosilane gas is increased continuously or stepwise after the $D_1$ is reached, and the hydrogen gas is supplied so that the chlorosilane gas concentration in the source gas is 15 mol % to less than 30 mol % after the $D_2$ is reached; and
    condition C: the temperature of the silicon rod is reduced with increasing diameter of the silicon rod after the $D_2$ is reached.

2. The method according to claim 1, wherein the silicon rod temperature in condition C is reduced by a temperature within a range of 50° C. to 350° C.

3. The method according to claim 1, wherein an operation of increasing the ratio of the supply amount of the hydrogen gas to the chlorosilane gas under the condition B is performed before the diameter of the silicon rod reaches 40 mm.

4. The method according to claim 1, wherein the reactor comprises a bell jar and a baseplate, and surface temperatures of the bell jar and the base plate in the reactor at the reaction start are controlled to 40° C. or more.

5. The method according to claim 4, wherein the reactor further comprises:
    a coolant circulation path adapted for controlling surface temperatures of the bell jar and the base plate, and
    a coolant temperature control unit adapted to control a temperature of a coolant flowing through the coolant circulation path to 40° C. to 90° C., to precipitate polycrystalline silicon while controlling the temperature of the coolant to 40° C. to 90° C.

6. The method according to claim 2, wherein an operation of increasing the ratio of the supply amount of the hydrogen gas to the chlorosilane gas under the condition B is performed before the diameter of the silicon rod reaches 40 mm.

7. The method according to claim 2, wherein the reactor comprises a bell jar and a baseplate, and surface temperatures of the bell jar and the base plate in the reactor at the reaction start are controlled to 40° C. or more.

8. The method according to claim 7, wherein the reactor further comprises:
a coolant circulation path adapted for controlling surface temperatures of the bell jar and the base plate, and
a coolant temperature control unit adapted to control a temperature of a coolant flowing through the coolant circulation path to 40° C. to 90° C., to precipitate polycrystalline silicon while controlling the temperature of the coolant to 40° C. to 90° C.

9. The method according to claim 1, wherein in condition A the supply amount is increased continuously.

10. The method according to claim 1, wherein in condition A the supply amount is increased stepwise.

11. The method according to claim 1, wherein the chlorosilane gas comprises trichlorosilane.

12. The method according to claim 1, wherein in condition B the hydrogen gas is supplied so that the chlorosilane gas concentration in the source gas is 30 mol % to less than 35 mol % until the $D_1$ is reached.

13. The method according to claim 11, wherein in condition B the hydrogen gas is supplied so that the chlorosilane gas concentration in the source gas is 30 mol % to less than 35 mol % until the $D_1$ is reached.

14. The method according to claim 1, wherein the reacting is performed at a reaction temperature of 970° C. to 1120° C. and under a reaction pressure of 0.4 to 0.6 MPa.

15. The method according to claim 13, wherein the reacting is performed at a reaction temperature of 970° C. to 1120° C. and under a reaction pressure of 0.4 to 0.6 MPa.

16. The method according to claim 2, wherein the chlorosilane gas comprises trichlorosilane.

\* \* \* \* \*